United States Patent [19]

De Vries

[11] Patent Number: 4,580,095
[45] Date of Patent: Apr. 1, 1986

[54] CURRENT DIVIDER FOR A MEASURING TRANSDUCER

[75] Inventor: Jacob De Vries, Allenwinden, Switzerland

[73] Assignee: LGZ Landis & Gyr Zug AG, Zug, Switzerland

[21] Appl. No.: 543,255

[22] Filed: Oct. 19, 1983

[30] Foreign Application Priority Data

Oct. 28, 1982 [CH] Switzerland .................. 6287/82

[51] Int. Cl.⁴ .......................................... H07F 40/06
[52] U.S. Cl. ................................... 324/126; 324/127; 338/49
[58] Field of Search ............... 324/126, 127; 338/49, 338/120, 333

[56] References Cited

U.S. PATENT DOCUMENTS 2,831,164  4/1985  Johnson ........................... 324/127
4,240,059 12/1980  Wolf et al. ........................ 338/49

FOREIGN PATENT DOCUMENTS 1133817  7/1962  Fed. Rep. of Germany .
2050070  3/1983  United Kingdom .

Primary Examiner—Stewart J. Levy
Assistant Examiner—Stephen M. Baker
Attorney, Agent, or Firm—Marmorek, Guttman & Rubenstein

[57] ABSTRACT

The present invention relates to a current divider for a measuring transducer. The current divider includes two conductors. The first conductor, which is operable as a shunt, comprises two generally flat legs which extend parallel to one another. Each leg defines one aperture into which the core of the measuring transducer extends. The second conductor is z-shaped having two arms and a bridge extending between the two arms. The arms are electrically connected to one of the legs and the bridge crosses the aperture therein, so that the bridge is surrounded by the core.

9 Claims, 3 Drawing Figures

CURRENT DIVIDER FOR A MEASURING TRANSDUCER

BACKGROUND OF THE INVENTION

1. Field of the Invention

This invention relates to a current divider for a measuring transducer. More particularly, this invention relates to the potential free measurement of currents, wherein the current to be measured is divided by means of a current divider into a measuring current and a shunt current and only the current flowing through the measuring current path is evaluated in the actual measuring transducer.

2. Description of the Prior Art

Such current dividers are described in the German Pat. No. 30 08 308 which corresponds to Great Britain Pat. No. 2,050,070 B. The current to be measured is divided into a measuring current and a shunt current by means of a current conductor which divides into two current paths in the direction of the current flow. Only the current which flows through the measuring path of the measuring transducer is utilized. The shunt path as well as the measuring path are arranged in space so far from one another that in operation they are differently heated or cooled. Consequently, no isothermic conditions exist for suppressing the measuring error due to thermal influence, such error is known to increase with the rise of current to be measured.

From U.S. Pat. No. 4,240,059, a current divider is known having two semicircular main current paths which form a circular conducting path and are connected by a measuring current path. The contact points of the measuring current path with the main current paths show slightly different potentials, so that a predetermined portion of the total current to be measured flows through the measuring current path. By changing the position of the measuring current path, the partial current which depends on the difference in potential, may be varied. Here again the isothermic conditions do not exist due to poor coupling of the individual portions of the measuring path. In addition, such solutions require compensated measuring transducers due to the small resistance of the measuring current path.

Reference is made to the U.S. patent application Ser. No. 509,447, of Richard Friedl, which was filed under the PCT Convention on Oct. 12, 1982.

SUMMARY OF THE INVENTION

It is therefore one of the principal objects of the invention to provide a current divider for measuring transducers wherein the listed disadvantages of the known solutions are to a great extend eliminated.

Other objects of the invention will in part be obvious and will in part appear hereinafter.

DESCRIPTION OF THE PREFERRED EMBODIMENTS

Figure 1:
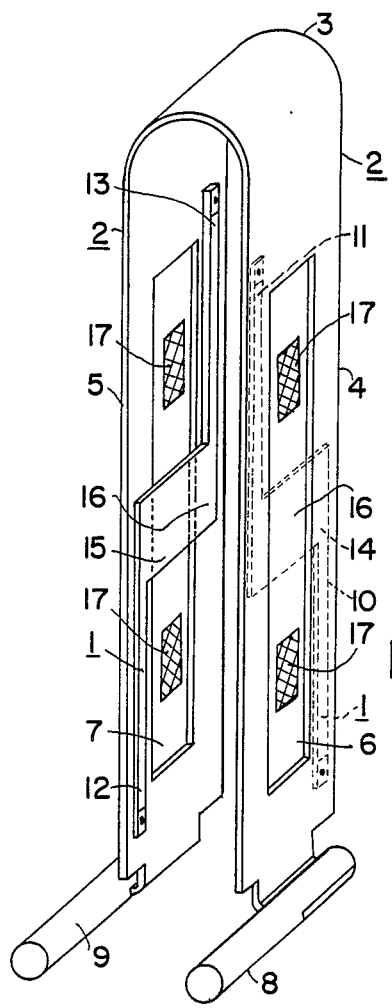
FIG. 1 is a perspective view of a current divider in accordance with the invention.
Figure 2:
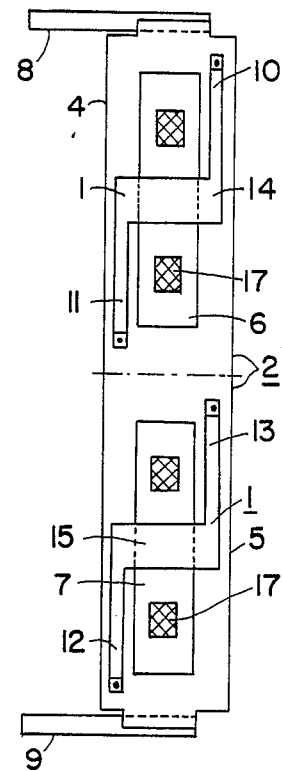
FIG. 2 is an elevational view of the inner sides of the current divider of FIG. 1, but projected into a plane.

Referring to the drawings, the current divider according to FIGS. 1 and 2 shows a current path comprising a measuring current path 1 and a shunt 2. The shunt 2 is composed of a flat conductor and in the instant embodiment has the shape of the letter U with two substantially parallel extending legs 4,5 connected by a bent portion 3. These legs 4, 5 are shown in the drawing far apart from one another, in order to be able to show clearly the arrangement of the measuring path. In reality, the legs 4, 5 are separated by an insulating layer (not shown), but lie closely together. Each leg 4, 5 is provided with an aperture 6, 7 and is connected to a current rail 8, 9 for the supply line of the whole current. The current measuring path 1 is formed by two Z-shaped current conductors with arms 10, 11, 12, 13 which are substantially parallel to the legs 4, 5 and each has a transverse portion 14 and 15; the Z-shaped measuring conductors are mounted on the inner wall of the legs 4, 5 in such a manner that the transverse portions 14, 15 lie, respectively, over the apertures 6, 7, respectively.

The ends of the arms 10, 11, 12, 13 are electrically interconnected to the legs 4, 5. This connection has to be designed in such a manner that their transfer resistance does not influence the dividing ratio. There is provided a separate insulating layer between the measuring conductors and the legs 4, 5. The cross section of the transverse portions 14, 15 is larger than the cross section of the ends of the arms 10, 11, 12, 13. The transverse portions 14, 15 form above the apertures 6, 7 of the shunt 2 a bridge 16 which is surrounded in the apertures 6, 7 of the legs 4, 5 by the core 17 of a measuring transducer of usual construction (not shown).

It is advantageous that the arms 10, 11, 12, 13 of the measuring conductors have the same length, as shown in FIGS. 1 and 2, so that the core 17 of the measuring transducer may be arranged symmetrically, that means in the middle between the two ends of the measuring conductors. By such an arrangement the influences of the magnetic external fields are to a large extent eliminated.

The two legs 4, 5 of the shunt 2 may be made as two separate parts which then are connected, for instance by screws or the like, instead of by the bent portion 3.

The whole current to be measured which is fed to the current rails 8, 9, is divided in proportion of the resistances of the measuring current path 1 and the shunt 2. All parts of the current divider show during operation essentially the same temperature, which is made possible through the crowded manner of construction with good thermic coupling of the individiual parts. The isothermic conditions for reducing the measuring error caused by different temperatures of individual parts, are thereby achieved. The low resistance of the broad transverse bridge portions 14, 15 has only a minimal effect upon the dividing ratio of the current divider. The resistance of the measuring path is sufficiently high so as to render it possible to use a conventional measuring transducer for the evaluation of the measured current.

By changing the dimensions of the measuring conductors, the resistance of the current dividers may be varied. By the symmetrical arrangement of the core 17, the effect of the magnetic outer fields is greatly reduced.

Figure 3:
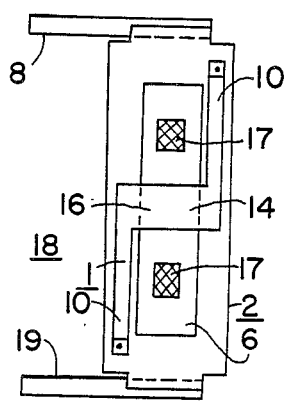
FIG. 3 is an elevational view similar to FIG. 2, but embodying a modification.

A simpler modification of the current divider is shown in FIG. 3. The shunt 2 here is formed by only one leg 18 which corresponds essentially to the legs 4 or 5 of FIGS. 1 and 2. Differing from leg 4, the leg 18 is provided also on its other end with a current rail 19 which serves together with the current rail 8 for feeding simultaneously the total current to be measured. All other components, that is the Z-shaped measuring conductor separated by an insulating layer from the leg 18, with the arms 10, 11, the ends of which are electrically connected with the leg 18, and with the transverse portion 14, are the same as with the leg 4.

The transverse portion 14 forms also here the bridge 16 which is surrounded in the aperture 6 of the leg 18 by the core 17 of a measuring transducer (not shown) of usual construction. The transverse portion 14 has a larger cross section than the arms 10, 11. Also here it is advantageous if the arms 10, 11 are of the same length, so that the cores 17 may be arranged symmetrically between the ends of the measuring conductor 10.

I wish it to be understood that I do not desire to be limited to the exact details of construction shown and described, for obvious modifications will occur to a person skilled in the art.

Having thus described the invention, what I claim as new and desire to be secured by Letters Patent is as follows:

1. A current divider, for use in a measuring transducer for the potential-free measurement of currents, comprising in combination,
   a current conductor adapted to receive a current to be measured, said current conductor including
   a first conductor operable as a shunt and including a flat conduit comprising two generally flat legs, positioned so that they face one another, each leg defining one aperture,
   a core of said measuring transducer extending into said apertures,
   at least one second conductor having Z-shape, and including two arms adjacent one of said legs and a connecting bridge,
   said Z-shaped conductor being connected to a surface of said one leg, said one leg being electrically connected to the ends of said arms, and said bridge crossing the aperture of said one leg and being surrounded by said core.

2. A current divider as claimed in claim 1 wherein said legs are substantially parallel to each other.

3. A current divider as claimed in claim 1 wherein said first conductor is U-shaped.

4. A current divider as claimed in claim 1 wherein said arms are substantially parallel to said one leg.

5. A current divider as claimed in claim 1 further comprising at least two current rails, each being connected to one of said legs to receive current simultaneously.

6. A current divider as claimed in claim 1 wherein said arms are of equal length.

7. A current divider as claimed in claim 1 wherein said legs are connected by screws so as to form said first conductor.

8. A current divider as claimed in claim 1, the portion of each of said arms crossing its respective aperture having a larger cross-section than the end portions of the respective arm.

9. A current divider, for use in a measuring transducer for the potential-free measurement of currents,
   comprising in combination,
   a current conductor adapted to receive a current to be measured, said current conductor including
   a first conductor operable as a shunt and including a flat conduit comprising a leg defining one aperture,
   a core of a measuring transducer extending through said aperture,
   a second conductor having Z-shape, and including two arms adjacent said leg and a connecting bridge,
   said Z-shaped conductor being connected to a surface of said one leg, said one leg being electrically connected to the ends of said arms, and said bridge crossing the aperture of said one leg and being surrounded by said core extending through said aperture.

* * * * *